United States Patent
Tung

(10) Patent No.: US 6,281,080 B1
(45) Date of Patent: Aug. 28, 2001

(54) FABRICATION METHOD IN IMPROVING ESD ABILITY AND VERTICAL BJT GAIN

(75) Inventor: Ming-Tsung Tung, Hsin-Chu (TW)

(73) Assignee: United Microelectronics Corp., Hsin-Chu City (TW)

( * ) Notice: Subject to any disclaimer, the term of this patent is extended or adjusted under 35 U.S.C. 154(b) by 0 days.

(21) Appl. No.: 09/309,971

(22) Filed: May 11, 1999

(51) Int. Cl.[7] .................... H01L 21/336; H01L 21/8234
(52) U.S. Cl. ..................... 438/275; 438/281; 438/288
(58) Field of Search .................................. 438/275, 281, 438/288, 237, 586

(56) References Cited

U.S. PATENT DOCUMENTS

| | | | |
|---|---|---|---|
| 5,455,444 | * 10/1995 | Hsue | 437/49 |
| 5,493,142 | * 2/1996 | Randazzo et al. | 257/328 |
| 5,543,649 | * 8/1996 | Kim et al. | 257/355 |
| 5,874,339 | * 2/1999 | Chang | 438/275 |
| 5,891,777 | * 4/1999 | Chang | 438/275 |
| 5,905,288 | * 5/1999 | Ker | 257/355 |
| 6,020,240 | * 2/2000 | Wu | 438/275 |

* cited by examiner

*Primary Examiner*—John F. Niebling
*Assistant Examiner*—Walter L. Lindsay, Jr.

(57) ABSTRACT

A method for forming a metal oxide semiconductor device having an improvement in its ESD ability and vertical BJT gain is disclosed. The method includes providing a semiconductor substrate, a well region, and isolation regions. The method also includes forming conducting electrodes by ion implantation to a first depth inside the well and then forming an inter-layer dielectric (ILD) overlying the overall surface of the resulting structure. The inter-layer dielectric is then patterned and etched to form contact windows and exposing the surfaces of the conducting electrodes. Subsequently, a plugging method is applied to implant impurity ions through the relevant contact windows into the respective conducting electrode to a second depth that is deeper than the first depth. Finally, the resulting structure is annealed to complete the overall procedure of the present invention.

25 Claims, 6 Drawing Sheets

FABRICATION METHOD IN IMPROVING ESD ABILITY AND VERTICAL BJT GAIN

BACKGROUND OF THE INVENTION

1. Field of the Invention

The present invention generally relates to a protection device and an improvement in device gain for Integrated Circuit (IC) technologies. More particularly, the present invention relates to electrostatic discharge (ESD) protection structures for metal-oxide-semiconductor (MOS) devices and gain improvement for parasitic bipolar devices.

2. Description of the Prior Art

Electrostatic discharge, ESD hereafter, is a common phenomenon that occurs when touching a grounded object with one's fingertips. Highly visible effects, such as sparks, might be seen during an ESD event. The sparks are the result of the ionization of the air-gap between the charged human body and the almost zero-potential surface of the grounded object. Clearly a high voltage discharge takes place under this circumstance. The high voltages result in large electric fields and high current densities in small devices which can lead to the breakdown of insulators and thermal damage in integrated circuits.

In a typical work environment a charge of about 0.6 uC can be induced on a body capacitance of 150 pF, leading to electrostatic potentials of 4000 volts or greater. Any contact by the charged human body with a grounded object such as an IC pin can result in a discharge for about 100 nanoseconds with peak currents in the ampere range. The energy associated with this discharge could mean failure to electronic devices and components. Typically, the damage is thermally initiated in the form of device or interconnect burnout. The high currents could also lead to on-chip voltages that are high enough to cause oxide breakdown in thin gate MOS processes. ESD protection for semiconductor ICs is, therefore, a reliability issue.

The most fundamental function of an ESD protection transistor is to conduct and draw ESD current away from the circuit it is protecting. Such ESD protection transistors are commonly used on microprocessors, embedded microcontrollers, application-specific integrated circuits and other logic devices, primarily for protection of internal circuits. For example, as shown in FIG. 1, an n-channel thick field-oxide (TFO) transistor generally used as a protection device is depicted. In the drawing, a semiconductor device 10 having a bond pad 11 and an internal circuit 12 to be protected. A line 13 connects the blocks 11 and 12. An n-channel TFO transistor T1 as an ESD protection device is disposed between the line 13 and ground, designated as GND, whereby the gate is tied to the drain and then connected to line 13. The source is connected to the GND voltage. The TFO transistor T1 acts as a parasitic bipolar transistor, and it must turn on before a MOS transistor of the internal circuit 12 reaches its impact ionization breakdown voltage. If the TFO transistor T1 is not designed to turn on first, then the internal circuit 12 will fail an ESD pulse or stress coming from the bond pad 11. Typically, the level of ESD protection will vary as the fabrication process changes due to variations in the on-resistance characteristics of the internal circuit 12. It will be appreciated that the method of the ESD protection transistor being discussed throughout the specification may be employed between bond pads and internal circuits.

A few approaches have been used to improve ESD protection transistors. For example, the use of silicide-blocked source and drain regions has been used to enhance ESD strength but still suffers insufficient ESD protection. Another common method to ensure that the ESD protection transistor turns on first is to increase the channel length of the internal circuit transistors so that they are harder to turn on. However, the current technology in ESD protection MOS transistors uses the ESD implant to dope the source/drain after the contact opens. The main purpose of ESD implant is to increase the impurity concentration and also to make the junction in the Lightly Doped Drain (LDD) regions deeper. The area of the drain region would be larger and wider for ESD implant, resulting in the easy occurrence of punch-through. A longer channel length is required in order to avoid the occurrence of punch-through. Due to the trend of making smaller and tinier semiconductor device sizes, the method of ESD implant and the method of ensuring the ESD protection transistor turns on first are not what is desired. Those two methods would both result in a larger chip area. Although increasing the well doping density for the method of ESD implant can also solve the problem of easily occurring punch-through, the higher the doping the lower the vertical BJT gain. This situation might also restrict the applications of certain electrical circuits.

SUMMARY OF THE INVENTION

In accordance with the present invention, a method is provided for forming a metal oxide semiconductor (MOS) device that substantially improves the device's ESD ability and also the parasitic vertical BJT gain. Accordingly, the present invention concerns an ESD protection device with higher energy ion implantation in raising the MOS devices' ESD ability without affecting devices' punch-through ability. Furthermore, the present invention enhances the diffusion overlap contact rule in order to avoid any misalignment. Moreover, in the field of parasitic BJT, the present invention raises the parasitic vertical BJT gain by increasing the emitter efficiency. Other features and advantages of the present invention will be apparent from the accompanying drawings and from the detailed description that follows.

In one of the preferred embodiments of the present invention, shown in FIG. 2I, a method for forming an electrostatic discharge (ESD) protection device is disclosed which comprises the following steps: First, providing a semiconductor substrate having a first conductivity type formed with a well having a second conductivity type. Second, forming an isolation region on top of a junction that is located in between the substrate and the well. Part of the isolation region is approximately half inside the substrate and half inside the well, and the remaining part of the isolation region is exposed above the surface of the substrate and the well. Third, a gate electrode is formed with a polysilicon layer on top of a thin gate oxide layer. Fourth, two electrodes are formed by implanting ions having the first conductivity type to a first depth inside the well. Fifth, an inter-layer dielectric (ILD) is formed overlying the overall surface of the resulting structure. And finally, the most important step of the present invention, after the formation of two contact windows through the inter-layer dielectric, a plugging method is used to implant high energy ions having the first conductivity type in the electrodes mentioned above to a second depth deeper than the first depth. The resulting structure is annealed afterwards.

The formation of the MOS device described in the above paragraph has a number of advantages compared with conventional methods. First of all, after the formation of the source/drain region, a plug implant can enhance the diffusion overlap contact rule in order to avoid the misalignment between the contact window and the source/drain region.

Also, a plug implant is used to improve ESD ability as it induces high current drive capability. Moreover, the plug implant only results in a deeper and higher density doping, so it will not affect the width of the doped region.

In another preferred embodiment of the present invention, shown in FIG. 3E, a method for fabricating a metal oxide semiconductor device is very similar to the previous embodiment and comprises the following steps: First, a substrate, a well, and four isolation regions instead of two are provided. Second, impurity ions having the first conductivity type are implanted in an exposed surface portion of the well, that is in between the center two isolation regions, to a first depth, thereby forming n.sup.+emitter region. Third, impurity ions are implanted having the second conductivity type in the remaining exposed surface portion of the well, thereby forming p.sup.+electrodes. Fourth, an ILD layer is formed with three contact windows. And finally, impurity ions are implanted having the first conductivity type by plugging method into the emitter region to a second depth, that is deeper than the first depth.

The high doping density at emitter region, shown in FIG. 3E, increases the injection efficiency and hence results in higher BJT gain. In both embodiments, the deeper the plug implant the smaller the width between the bottom of the emitter region and the bottom of the well, i.e. the base width, and hence higher parasitic vertical BJT gain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 2A–2I, the process flow of one preferred embodiment according to the present invention is depicted in cross-sectional views. These drawings merely show several key steps in sequential processes.

Figure 1:
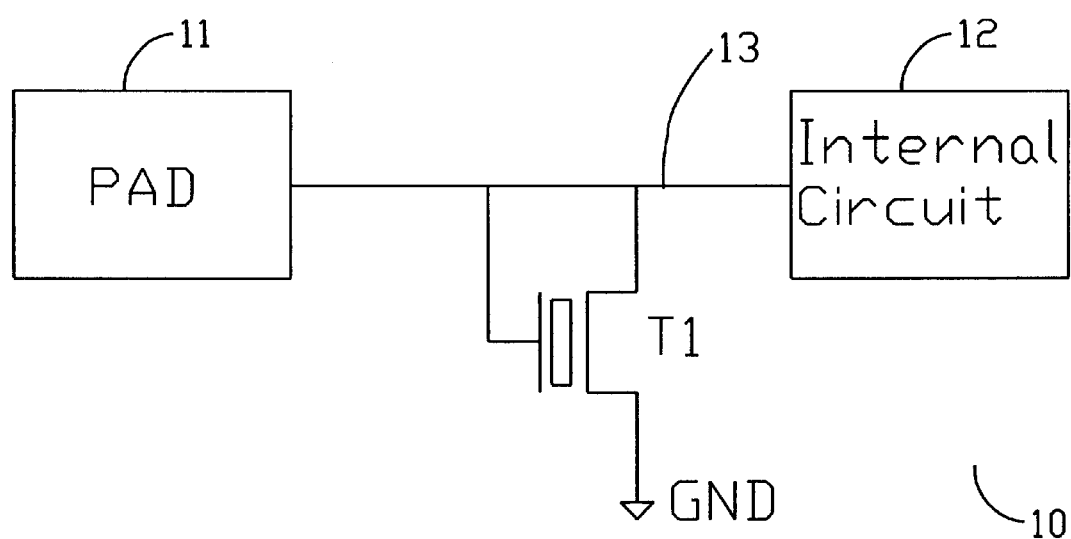
FIG. 1 depicts a circuit diagram having a thick field oxide transistor as an ESD protection device.
Figure 2A:
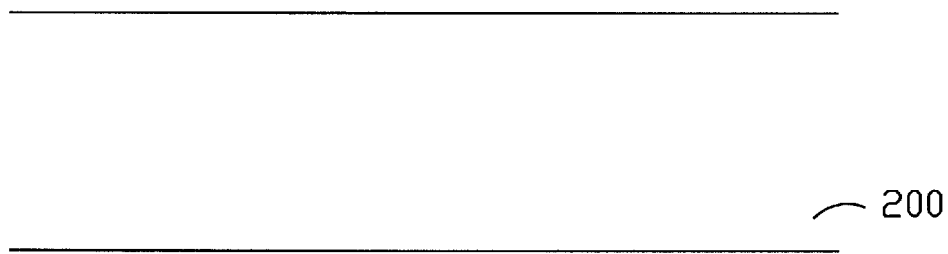
FIG. 2A to FIG. 2I depict the process flow of one preferred embodiment according to the present invention in cross-sectional views.
Figure 2B:
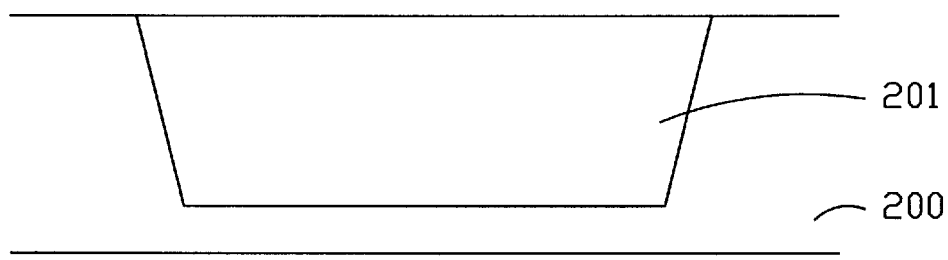

As first shown in FIG. 2A, a semiconductor substrate 200 having a first conductivity type is provided. FIG. 2B shows that within the substrate 200 is formed a well region 201 by means of ion implantation, the well region 201 having a second conductivity type which is opposite the first conductivity type. The semiconductor substrate 200 might be either an n-type silicon substrate or a p-type silicon substrate. If the fabricated ESD protection device is an n-channel device, the well region 201 is a p-well region as exemplified in the drawings.

Figure 2C:
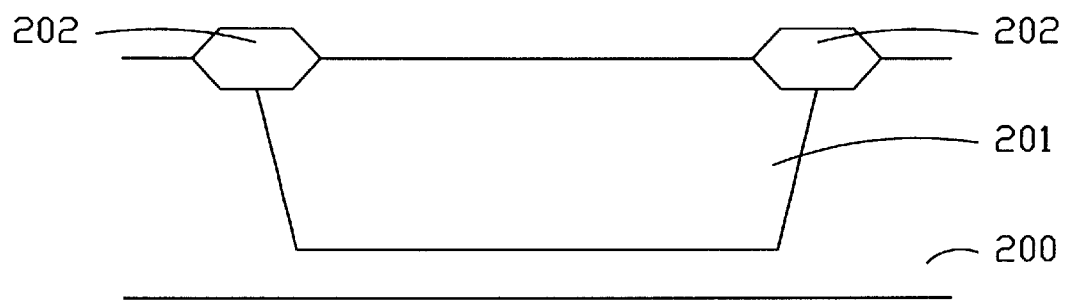

Next, as shown in FIG. 2C, an isolation region 202 is formed on top of a junction between the substrate 200 and the well region 201, a portion of which extends upward above the surface of the substrate 200 and the well 201. The isolation region 202 which comprises silicon oxide can be formed using trench isolation, or can be field oxide (FOX) formed by local oxidation of silicon (LOCOS).

Figure 2D:
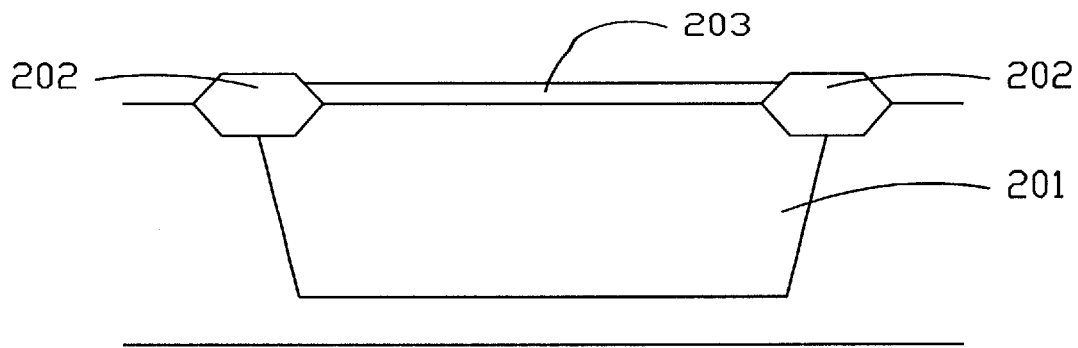
Figure 2E:
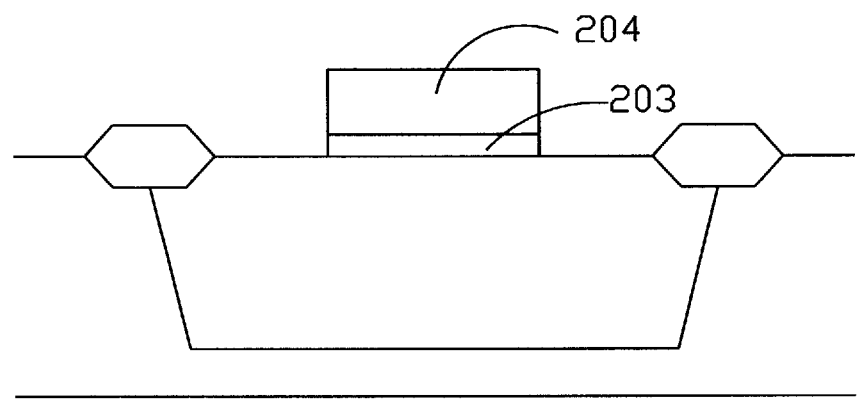

Referring to FIG. 2D, a thermal oxidation process is used to form a thin gate oxide layer 203 having approximately the same height as the top surface of the isolation regions 202 and covering the entire exposed surface of the well region 201. Subsequently, a polysilicon layer is formed and spreads across the entire exposed upper surface of the resulting structure obtained after the formation of the gate oxide layer 203, preferably, in a chemical vapor deposition (CVD) chamber. Then a gate mask is patterned and etches back the unwanted portion of the polysilicon layer and the gate oxide layer 203, thus a gate electrode 204 is formed and also exposes a portion of the well's top surface. The resulting structure at this stage of the process is shown in FIG. 2E.

Figure 2F:
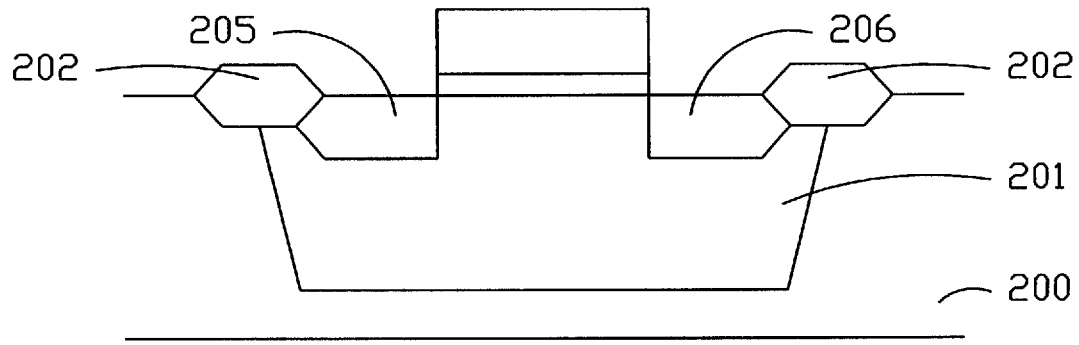
Figure 2G:
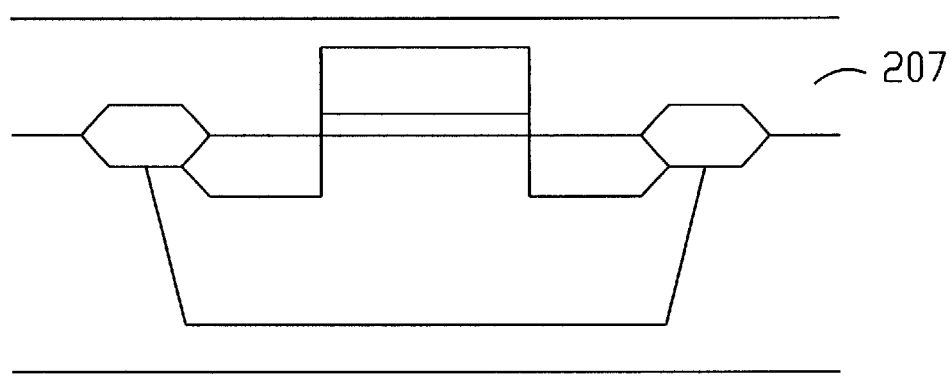

Referring to FIG. 2F, using the gate mask in the previous stage and the isolation regions 202 as additional masking, n-type impurities are implanted into the exposed portion of the well region 201 to a first depth to form n.sup.+source region 205 and n.sup.+drain region 206. Sequentially, as is shown in FIG. 2G, an inter-layer dielectric (ILD) 207 is formed overlying the overall surface, wherein the inter-layer dielectric 207 can at least be formed by using the method of chemical mechanical polishing (CMP). The inter-layer dielectric is made of silicon oxide.

Figure 2H:
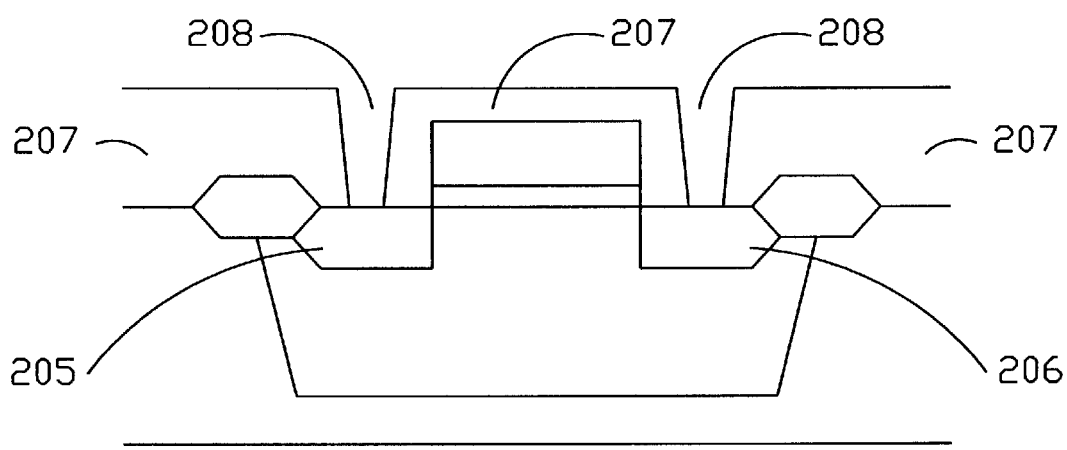
Figure 2I:
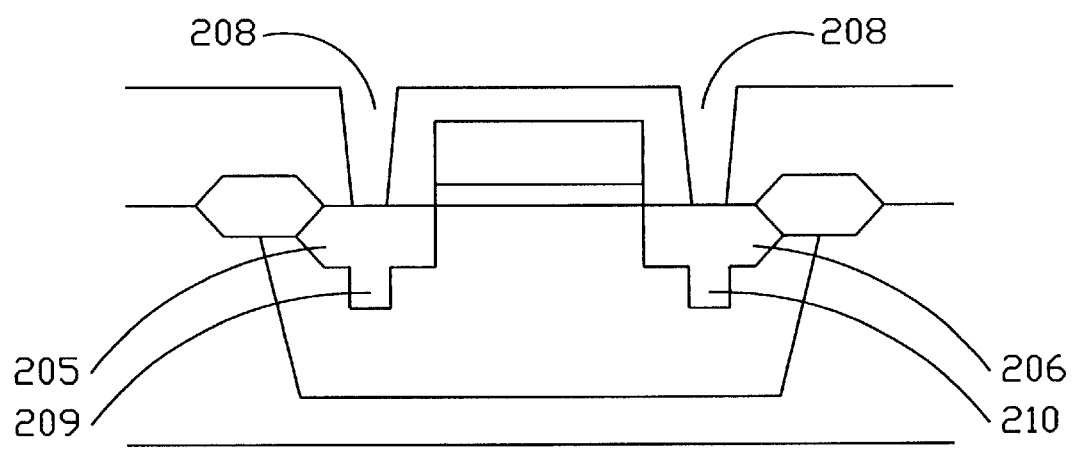

Referring to FIG. 2H, the inter-layer dielectric 207 is patterned and etched to form a pair of contact windows 208 and to expose a portion of source region 205 and drain region 206. Subsequently, as shown in FIG. 2I, a plugging method is applied to implant n-type impurity ions through those contact windows 208 into source region 205 to its second depth 209 and into drain region 206 to its second depth 210. The second depth of both the source and the drain region is deeper than the first depth, and the doping density of these two different depths are almost equal or, alternatively, one can be slightly heavier than the other. Finally, the resulting structure is annealed.

Referring to FIGS. 3A–3E, the process flow of another preferred embodiment according to the present invention is depicted in cross-sectional views. A method for fabricating a metal oxide semiconductor device is enclosed, which is very similar to what has already been described in the first embodiment. Those drawings only show several key steps and differences in device structure in sequential processes.

Figure 3A:
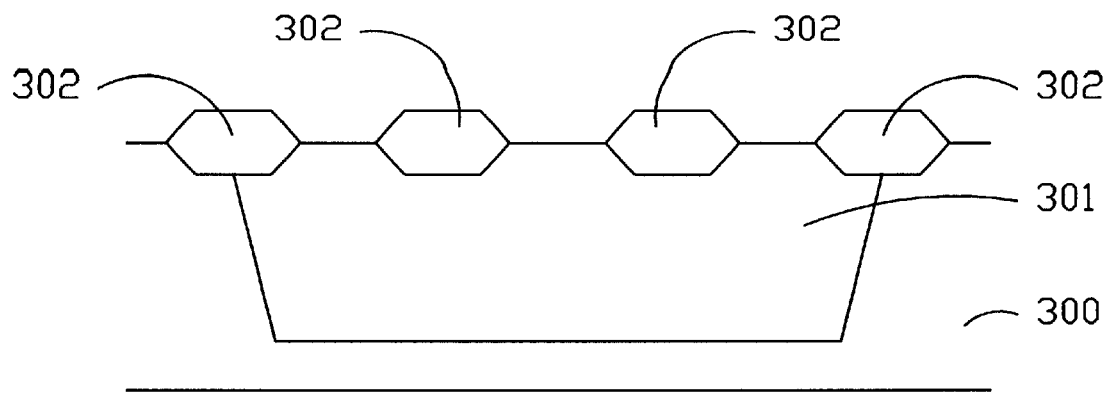
FIG. 3A to FIG. 3E depict the process flow of another preferred embodiment according to the present invention in cross-sectional views.

As first shown in FIG. 3A, the same procedure as set forth in the previous embodiment is used to form a semiconductor structure, similar to what is shown in FIG. 2C, having a substrate 300, a well region 301, and isolation regions 302. The only difference is that there are four isolation regions 302, instead of two, with approximately equal distances apart.

Figure 3B:
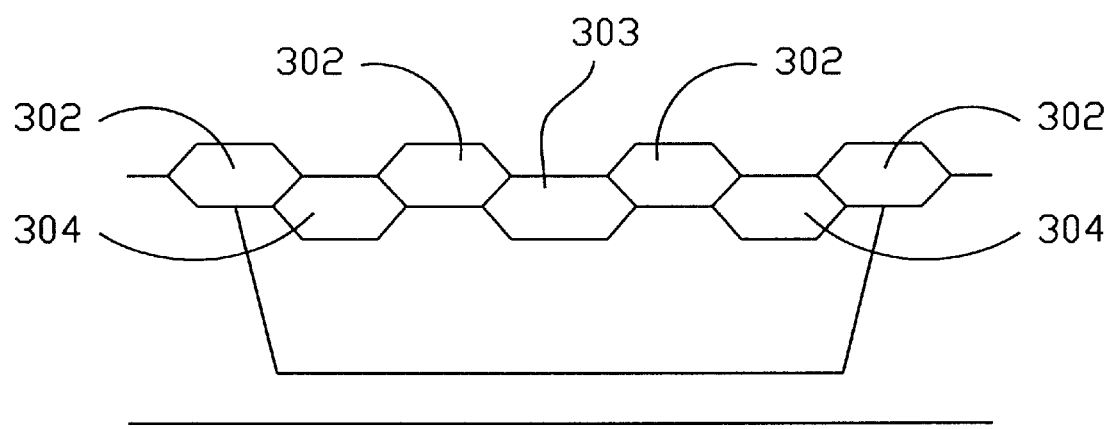
Figure 3C:
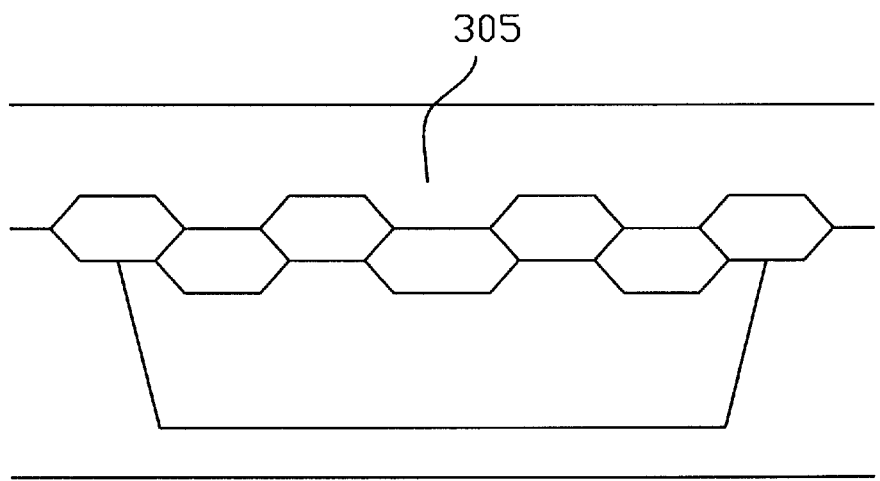

Referring to FIG. 3B, using an emitter mask and the isolation regions 302 as additional masking, n-type impurities are implanted into the exposed well region between the center two isolation regions to a first depth to form n.sup.+ emitter region 303. Two p.sup.+electrode regions 304 are formed by applying a similar procedure. Sequentially, as shown in FIG. 3C, the same method used in FIG. 2G is applied to form an inter-layer dielectric (ILD) 305 overlying the overall surface.

Figure 3D:
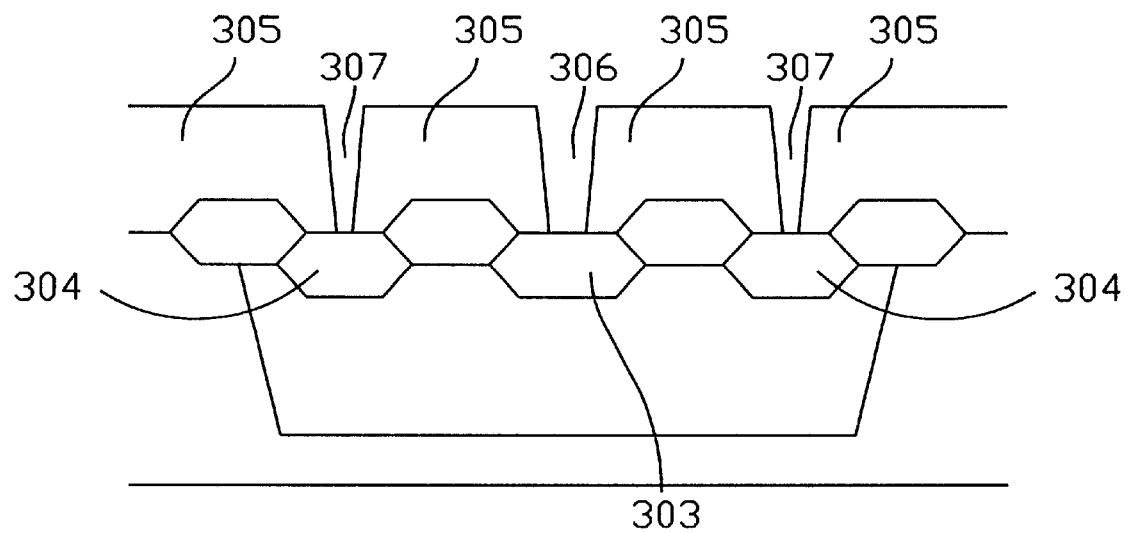
Figure 3E:
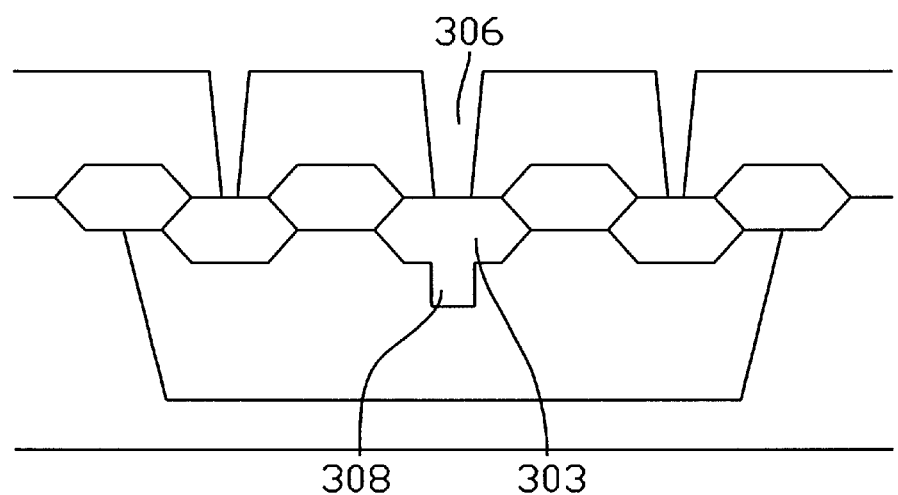

Referring to FIG. 3D, the inter-layer dielectric 305 is patterned and etched to form three contact windows 306 and 307 to expose a portion of emitter region 303 and a portion of electrode regions 304. Subsequently, as shown in FIG. 3E, a plugging method is applied to implant n-type impurity ions through the contact window 306 into emitter region 303 to a second depth 308. The second depth of the emitter region is deeper than the first depth, and the doping density of these two different depths are almost equal or, alternatively, one can be slightly heavier than the other. Finally, the resulting structure is annealed.

In conclusion, although there are at least two embodiments with two different device structures in the present invention, it is the method for fabricating the devices that is emphasized in this application. Specifically, the present invention provides a method for fabricating metal oxide semiconductor devices having an improvement in their ESD ability without affecting their punch-through ability and furthers offers an enhancement in the parasitic vertical BJT gain, as well as an improvement in the diffusion overlap contact rule.

Although specific embodiments have been illustrated and described, it will be obvious to those skilled in the art that various modifications may be made without departing from what is intended to be limited solely by the appended claims.

What is claimed is:

1. A method for forming an electrostatic discharge (ESD) protection device comprising:
   providing a substrate having a first conductivity type formed with a well having a second conductivity type;
   forming an isolation region on top of a junction between said substrate and said well;
   forming a gate oxide layer on top of the exposed surface of said well;
   forming a polysilicon layer over the exposed upper surface of the resulting structure obtained after the formation of said gate oxide layer;
   forming a gate electrode;
   implanting ions having the first conductivity type in an exposed surface portion of said well to a first depth, thereby forming n.sup.+electrodes;
   forming an inter-layer dielectric (ILD) overlying the overall surface of said device;
   forming two contact windows through said inter-layer dielectric;
   implanting ions having the first conductivity type in said electrodes to a second depth deeper than said first depth; and
   annealing the resulting structure.

2. The method in accordance with claim 1, wherein said semiconductor substrate is an n-type silicon substrate.

3. The method in accordance with claim 1, wherein said well having a p-type conductivity.

4. The method in accordance with claim 1, wherein said isolation region can be field oxide structure which comprises silicon oxide.

5. The method in accordance with claim 4, wherein said silicon oxide is formed by one of the following methods: local oxidation of silicon (LOCOS), trench.

6. The method in accordance with claim 1, wherein the formation of said gate oxide layer is carried out using thermal oxidation process.

7. The method in accordance with claim 1, wherein said inter-layer dielectric can at least be formed by using the method of chemical mechanical polishing (CMP).

8. The method in accordance with claim 1, wherein the step of forming said electrodes comprises the steps of forming a photoresist layer pattern on the polysilicon layer, and selectively removing the polysilicon layer under the condition in which the photoresist layer pattern is used as a mask.

9. The method in accordance with claim 1, wherein said inter-layer dielectric comprises silicon oxide.

10. A method for fabricating an electrostatic discharge (ESD) protection transistor, comprising:
    providing a semiconductor substrate having a first conductivity type formed with a well having a second conductivity type which is opposite to said first conductivity type;
    forming a field oxide (FOX) structure on top of a junction between said substrate and said well, a portion of which extends upward above the surface of said substrate and said well;
    forming a gate oxide layer on top of the exposed surface of said well;
    forming a polysilicon layer over the entire exposed upper surface of the resulting structure obtained after the formation of said gate oxide layer;
    selectively removing said polysilicon layer and said gate oxide layer, thereby forming a gate electrode;
    implanting impurity ions having the first conductivity type in an exposed surface portion of said well to a first depth, thereby forming n.sup.+source/drain region;
    forming an inter-layer dielectric (ILD) overlying the overall surface of said device;
    forming two contact windows through said inter-layer dielectric, each window exposing a portion of said source/drain region;
    implanting impurity ions having the first conductivity type by plugging method in said source/drain region to a second depth deeper than said first depth; and
    annealing the resulting structure.

11. The method in accordance with claim 10, wherein said semiconductor substrate is an n-type silicon substrate.

12. The method in accordance with claim 10, wherein said well having a p-type conductivity.

13. The method in accordance with claim 10, wherein said field oxide structure comprises silicon oxide.

14. The method in accordance with claim 13, wherein said silicon oxide is formed by a process of local oxidation of silicon (LOCOS).

15. The method in accordance with claim 10, wherein the formation of said gate oxide layer is carried out using thermal oxidation process.

16. The method in accordance with claim 10, wherein said inter-layer dielectric can at least be formed by using the method of chemical mechanical polishing (CMP).

17. The method in accordance with claim 10, wherein the step of forming said source/drain region comprises the steps of forming a photoresist layer pattern on the polysilicon layer, and selectively removing the polysilicon layer under the condition in which the photoresist layer pattern is used as a mask.

18. The method in accordance with claim 10, wherein said inter-layer dielectric comprises silicon oxide.

19. A method for fabricating a metal oxide semiconductor device, comprising:
    providing a semiconductor substrate having a first conductivity type formed with a well having a second conductivity type which is opposite to said first conductivity type;
    forming two isolation regions on top of said well and an isolation region on top of a junction between said substrate and said well;
    implanting impurity ions having the first conductivity type in an exposed surface portion of said well and between said two isolation regions to a first depth, thereby forming n.sup.+emitter region;

implanting impurity ions having the second conductivity type in the remaining exposed surface portion of said well, thereby forming p.sup.+electrodes;

forming an inter-layer dielectric (ILD) overlying the overall surface of said device;

forming contact windows through said inter-layer dielectric, each window exposing a portion of said emitter region and electrodes;

implanting impurity ions having the first conductivity type by plugging method in said emitter region to a second depth deeper than said first depth; and annealing the resulting structure.

20. The method in accordance with claim 19, wherein said semiconductor substrate is an n-type silicon substrate.

21. The method in accordance with claim 19, wherein said well having a p-type conductivity.

22. The method in accordance with claim 19, wherein said isolation region can be field oxide structure which comprises silicon oxide.

23. The method in accordance with claim 22, wherein said silicon oxide is formed by one of the following methods: local oxidation of silicon (LOCOS), trench.

24. The method in accordance with claim 19, wherein said inter-layer dielectric can at least be formed by using the method of chemical mechanical polishing (CMP).

25. The method in accordance with claim 19, wherein said inter-layer dielectric comprises silicon oxide.

* * * * *